United States Patent
Kang et al.

(10) Patent No.: US 9,045,822 B2
(45) Date of Patent: Jun. 2, 2015

(54) DEPOSITION SOURCE, DEPOSITION APPARATUS, AND METHOD OF MANUFACTURING ORGANIC LIGHT-EMITTING DISPLAY APPARATUS

(75) Inventors: Tae-Wook Kang, Yongin (KR); Jeong-Ho Yi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 4 days.

(21) Appl. No.: 13/593,134

(22) Filed: Aug. 23, 2012

(65) Prior Publication Data

US 2013/0196076 A1    Aug. 1, 2013

(30) Foreign Application Priority Data

Feb. 1, 2012    (KR) .................. 10-2012-0010381

(51) Int. Cl.
| | |
|---|---|
| C23C 16/56 | (2006.01) |
| C23C 14/12 | (2006.01) |
| C23C 14/24 | (2006.01) |
| C23C 14/58 | (2006.01) |
| B05D 3/06 | (2006.01) |
| B05D 1/00 | (2006.01) |

(52) U.S. Cl.
CPC ............... *C23C 14/12* (2013.01); *C23C 14/243* (2013.01); *C23C 14/58* (2013.01); *B05D 3/067* (2013.01); *B05D 1/60* (2013.01)

(58) Field of Classification Search
None
See application file for complete search history.

(56) References Cited

U.S. PATENT DOCUMENTS

| | | | |
|---|---|---|---|
| 6,682,782 B2 | 1/2004 | Jung et al. | |
| 6,805,439 B2 | 10/2004 | Maeda et al. | |
| 7,338,556 B2 | 3/2008 | Kim et al. | |
| 7,510,913 B2 | 3/2009 | Moro et al. | |
| 7,648,925 B2 | 1/2010 | Moro et al. | |
| 7,727,601 B2 | 6/2010 | Burrows et al. | |
| 8,119,188 B2 | 2/2012 | Kuwabara | |
| 2001/0002279 A1* | 5/2001 | Forrest et al. | 427/255.26 |
| 2003/0210311 A1 | 11/2003 | Kim et al. | |
| 2006/0256247 A1 | 11/2006 | Hirai et al. | |
| 2007/0049155 A1 | 3/2007 | Moro et al. | |
| 2009/0191342 A1 | 7/2009 | Chu et al. | |
| 2009/0208754 A1 | 8/2009 | Chu et al. | |
| 2009/0238999 A1* | 9/2009 | Han et al. | 427/585 |
| 2010/0096984 A1* | 4/2010 | Kim | 313/512 |
| 2010/0148157 A1* | 6/2010 | Song et al. | 257/40 |
| 2010/0156277 A1 | 6/2010 | Visser et al. | |
| 2010/0159792 A1 | 6/2010 | Visser et al. | |

(Continued)

FOREIGN PATENT DOCUMENTS

| | | |
|---|---|---|
| KR | 10-0360308 | 10/2002 |
| KR | 10-0475162 | 2/2005 |

(Continued)

*Primary Examiner* — Joseph Miller, Jr.
(74) *Attorney, Agent, or Firm* — Robert E. Bushnell, Esq.

(57) ABSTRACT

A deposition source for depositing a deposition material on a substrate, the deposition source including: a nozzle disposed to face the substrate and discharge the deposition material toward the substrate; and a hardening portion disposed to at least one side of the nozzle for immediately hardening the deposition material discharged via the nozzle when the deposition material reaches the substrate. The deposition source being part of a deposition apparatus for manufacturing an organic light-emitting display having improved characteristics of a deposited film and encapsulation characteristics.

6 Claims, 10 Drawing Sheets

(56) References Cited

U.S. PATENT DOCUMENTS

| | | |
|---|---|---|
| 2010/0167002 A1 | 7/2010 | Chu et al. |
| 2011/0127502 A1 | 6/2011 | Kim |
| 2011/0154854 A1 | 6/2011 | Boesch et al. |
| 2012/0009332 A1 | 1/2012 | Kim et al. |

FOREIGN PATENT DOCUMENTS

| | | |
|---|---|---|
| KR | 10-0730220 | 6/2007 |
| KR | 10-2011-0079502 | 7/2011 |

* cited by examiner

DEPOSITION SOURCE, DEPOSITION APPARATUS, AND METHOD OF MANUFACTURING ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on the 1$^{st}$ day of Feb. 2012 and there duly assigned Serial No. 10-2012-0010381.

BACKGROUND OF THE INVENTION

1. Field of the Invention

The present invention relates to a deposition source, a deposition apparatus, and a method of manufacturing an organic light-emitting display, and more particularly, to a deposition source, a deposition apparatus, and a method of manufacturing an organic light-emitting display that may improve characteristics of a deposited film and encapsulation characteristics.

2. Description of the Related Art

Various kinds of flat plate displays capable of reducing a weight and volume which are disadvantages of a cathode ray tube (CRT) haven been emerging recently. Such a flat plate display includes a liquid crystal display (LCD), a field emission display, a plasma display panel (PDP), an electro-luminescence (EL) display and an organic light-emitting display (OLED). Flat plate displays are being developed that are thin and portable. Among the flat plate displays, organic light-emitting apparatuses are self-emitting type display apparatuses that have attracted much attention as next-generation display apparatuses because of wide viewing angles, good contrast, and fast response speeds.

An organic light-emitting display includes an intermediate layer, a first electrode, and a second electrode. The intermediate layer includes an organic emission layer which emits visible light if a voltage is applied to the first and second electrodes.

In this instance, the organic light-emitting display may be contaminated and damaged due to an encapsulation member disposed over the second electrode or due to impurities. In order to prevent this, various encapsulation members, for example, an encapsulation layer, such as an organic encapsulation layer or an inorganic encapsulation layer, may be formed.

However, since it is difficult to perform a process of forming the encapsulation layer, there is a limitation in improving characteristics of the encapsulation layer, and thus, there is a limitation in improving encapsulation characteristics of the organic light-emitting display.

SUMMARY OF THE INVENTION

The present invention provides a method of manufacturing an organic light-emitting display that improves characteristics of a deposited film and encapsulation characteristics.

According to an aspect of the present invention, there is provided deposition source for depositing a deposition material on a substrate, the deposition source comprising a nozzle disposed to face the substrate and discharge the deposition material toward the substrate, and a hardening portion disposed to at least one side of the nozzle, the hardening portion immediately hardening the deposition material only after the deposition material reaches the substrate.

There may be a plurality of the hardening portions, the plurality of the hardening portions may be disposed at opposite sides of the nozzle.

The hardening portions may simultaneously harden the deposition material.

The hardening portion may harden the deposition material by emitting ultraviolet (UV) light.

The hardening portion may include an ultraviolet (UV) irradiation unit and a body generating UV light connected to the UV irradiation unit.

The hardening portion may harden the deposition material by emitting visible light.

The deposition source may further include a crucible accommodating the deposition material, wherein the nozzle is connected to the crucible.

The nozzle may receive the deposition material from an evaporation apparatus disposed outside of the deposition source.

The hardening portion may comprise a pair of hardening portions disposed to at least one side of the nozzle.

According to another aspect of the present invention, there is provided a deposition apparatus for depositing a deposition material on a substrate, the deposition apparatus comprising a chamber, a stage disposed inside the chamber, the substrate being mounted on the stage, and a deposition source disposed to face the substrate, the deposition source having a nozzle for discharging the deposition material toward the substrate and a hardening portion disposed to at least one side of the nozzle, the hardening portion immediately hardening the deposition material only after the deposition material reaches the substrate.

The substrate and the deposition source may perform a deposition process while moving with respect to each other.

The deposition apparatus may include a driving unit connected to the stage so as to move the stage.

The deposition apparatus may include a driving unit connected to the deposition source so as to move the deposition source.

The hardening portion may comprise a plurality of the hardening portions, the plurality of the hardening portions may be disposed at opposite sides of the nozzle.

The plurality of hardening portions may simultaneously harden the deposition material.

The hardening portion may harden the deposition material by emitting ultraviolet (UV) light.

The hardening portion may include an ultraviolet (UV) irradiation unit and a body generating UV light connected to the UV irradiation unit.

The hardening portion may harden the deposition material by emitting visible light.

The deposition source may include a crucible accommodating the deposition material, wherein the nozzle is connected to the crucible.

The deposition source may include an evaporation apparatus disposed outside of the chamber, wherein the nozzle receives the deposition material from the evaporation apparatus.

The deposition source may include a liquid material supplying apparatus, disposed outside of the chamber, for supplying the deposition material to the evaporation apparatus.

The deposition source may include an atomizer disposed between the liquid material supplying apparatus and the evaporation apparatus.

The hardening portion may include a pair of hardening portions disposed to at least one side of the nozzle.

The chamber may include a process chamber in which the deposition source and the substrate are disposed, and an align chamber that is disposed adjacent to the process chamber for aligning the substrate on the stage through an inlet/outlet between the process chamber and the align chamber.

According to another aspect of the present invention, there is provided a method of manufacturing an organic light-emitting display, the method comprising forming a first electrode on a substrate, forming an intermediate layer comprising an organic emission layer on the first electrode, forming a second electrode on the intermediate layer, forming a first inorganic encapsulation layer on the second electrode, and forming a first organic encapsulation layer by disposing an organic material on the first inorganic encapsulation layer through a nozzle for discharging an inorganic material toward the substrate and immediately hardening the inorganic material by a hardening portion disposed to at least one side of the nozzle only after the inorganic material reaches the substrate.

The hardening of the organic material may be performed by emitting ultraviolet (UV) light.

The forming of the first organic encapsulation layer may be performed by using a deposition apparatus for discharging a deposition material toward the substrate, and the forming of the first organic encapsulation layer may be performed by moving the substrate or the deposition apparatus so that the substrate and the deposition apparatus move with respect to each other.

The method may further include forming a second inorganic encapsulation layer on the first organic encapsulation layer.

The method may further include forming at least one inorganic encapsulation layer and at least one organic encapsulation layer on the second inorganic encapsulation layer.

The organic material may be an organic material monomer including acryl, an epoxy-based monomer, or a silicon-based monomer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Now, an exemplary embodiment according to the present invention will be described in detail with reference to the accompanying drawings.

Figure 1:
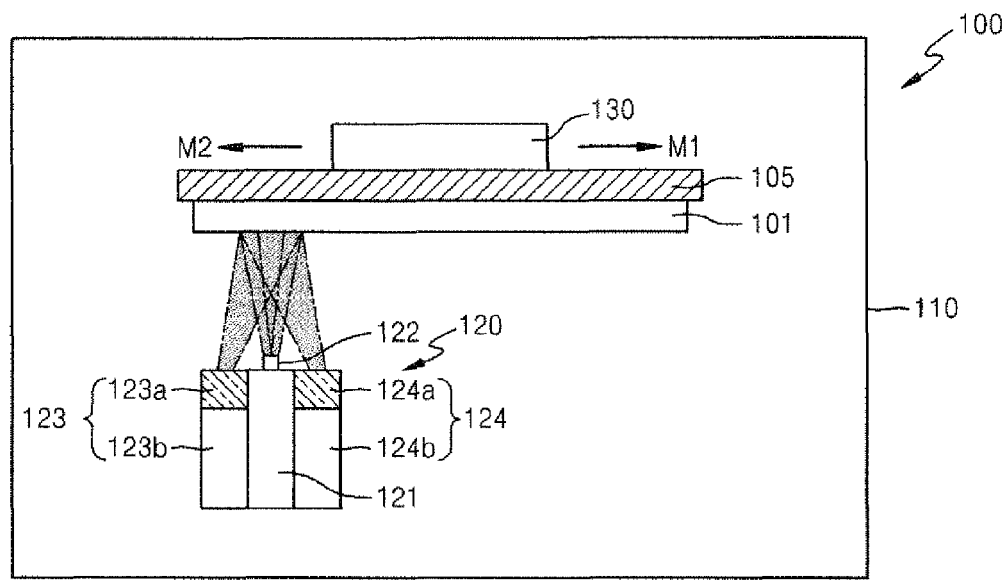
FIG. 1 is a schematic view of a deposition source and a deposition apparatus including the deposition source according to an embodiment of the present invention.

FIG. 1 is a schematic view of a deposition source and a deposition apparatus including the deposition source according to an embodiment of the present invention.

Referring to FIG. 1, a deposition apparatus 100 includes a chamber 110, a deposition source 120, a stage 105, and a driving unit 130.

Although not shown in FIG. 1, the chamber 110 includes at least one inlet/outlet through which a substrate 101 may pass. Also, the chamber 110 may be connected to a pump (not shown) for controlling pressure so as to maintain proper pressure in the chamber 110. Alternatively, the chamber 110 may be maintained at air pressure.

The stage 105 is disposed inside the chamber 110. The substrate 101 is mounted on one surface of the stage 105. A fixing device (not shown) may be used to fix the substrate 101 mounted on the stage 105. The fixing device may be any of various types of devices, for example, a clamp, a pressing device, an adhesive material, or the like.

The deposition source 120 faces the substrate 101. The deposition source 120 includes a crucible 121, a nozzle 122, and hardening portions 123 and 124.

The crucible 121 accommodates a deposition material (not shown). A heating device, such as a heater (not shown), for heating the deposition material may be disposed around the crucible 121.

The nozzle 122 is connected to the crucible 121 so that the deposition material evaporates, is discharged via the nozzle 122, and then moves toward the substrate 101, thereby forming a deposited film on the substrate 101.

The hardening portions 123 and 124 are disposed at opposite sides of the nozzle 122 and crucible 121.

The hardening portion 123 includes an ultraviolet (UV) irradiation unit 123a and a body 123b. The body 123b generates UV light, and the UV irradiation unit 123a irradiates the generated UV light toward the substrate 101. However, the present invention is not limited thereto, and the UV irradiation unit 123a and the body 123b may be formed as one body.

The hardening portion 124 includes an UV irradiation unit 124a and a body 124b. The body 124b generates UV light, and the UV irradiation unit 124a irradiates the generated UV light toward the substrate 101. However, the present invention is not limited thereto, and the UV irradiation unit 124a and the body 124b may be formed as one body.

Although a hardening process using UV light has been described in the current embodiment, the present invention is not limited thereto. In other words, the hardening portion 123 and the hardening portion 124 may generate and irradiate visible light. For this, the hardening portion 123 and the hardening portion 124 may include a body (not shown) and an irradiating unit (not shown) for irradiating visible light.

The hardening portion 123 and the hardening portion 124 are disposed adjacent to the nozzle 122 to simultaneously harden the deposition material as soon as the deposition material discharged via the nozzle 122 reaches the substrate 101.

The driving unit 130 is connected to the stage 105. The driving unit 130 may move the stage 105 in a first direction (in a direction of an arrow M1) or in a second direction (in a direction of an arrow M2) that is opposite to the first direction, as shown in FIG. 1.

Hereinafter, operations and effects of the deposition apparatus 100 of the current embodiment will be simply described.

The deposition material is seated on the substrate 101 via the nozzle 122 to form the deposited film on the substrate 101. In particular, when an organic material monomer having liquidity is accommodated as the deposition material in the crucible 121, the organic material monomer is discharged via the nozzle 122 and reaches the substrate 101.

As soon as the deposition material reaches the substrate 101, the deposition material, that is, the organic material monomer, is immediately hardened through the hardening portion 123 and the hardening portion 124, thereby improving characteristics of the deposited film formed on the substrate 101. In this regard, a time corresponding to 'immediately' refers to a time within a range in which a defect does not occur. For example, if a defect does not occur within 5 seconds after the deposition material reaches the substrate 101, 'immediately' refers to a time within 5 seconds, which will be described below.

Also, the deposited film may be formed on the entire surface or a desired surface of the substrate 101 by successively performing the above-described operation while moving the substrate 101.

In detail, when the organic material monomer is deposited as the deposition material on the substrate 101 via the nozzle 122, since the organic material monomer has liquidity and is hardened after a time since the organic material monomer reached the substrate 101, the organic material monomer may have desired characteristics of a deposited film. Such an organic material monomer film having liquidity before being hardened may affect components (not shown) disposed below the organic material monomer film. In other words, impurities from the organic material monomer may permeate into the components (not shown) disposed below the deposited film to thus contaminate the components.

Also, when the organic material monomer having liquidity moves on the substrate 101 before being hardened, the deposited film having a non-uniform shape may be finally formed on the substrate 101, thereby decreasing characteristics of the deposited film.

However, in the current embodiment, as soon as the organic material reaches the substrate 101 via the nozzle 122, the organic material monomer is hardened through the hardening portions 123 and 124, and thus, there is no time for impurities to be released from the organic material having reached the substrate 101 and no time for the organic material deposited film to move on the substrate 101.

In particular, when the hardening portions 123 and 124 simultaneously harden the organic material monomer, discharged via the nozzle 122, when it reaches the substrate 101, the organic material monomer is rapidly hardened as soon as the organic material monomer film is formed on the substrate 101, and thus there is no time for the organic material monomer film having liquidity to move on the substrate 101.

Accordingly, desired characteristics of the deposited film may be easily obtained, and the components disposed below the deposited film are prevented from being contaminated during formation of the deposited film. Also, since the deposition process is performed while moving the substrate 101, even when the deposition process is performed on the entire surface or a desired surface of the substrate 101, the characteristics of the deposited film maybe easily obtained and the components disposed below the deposited film are prevented from being contaminated.

Figure 2:
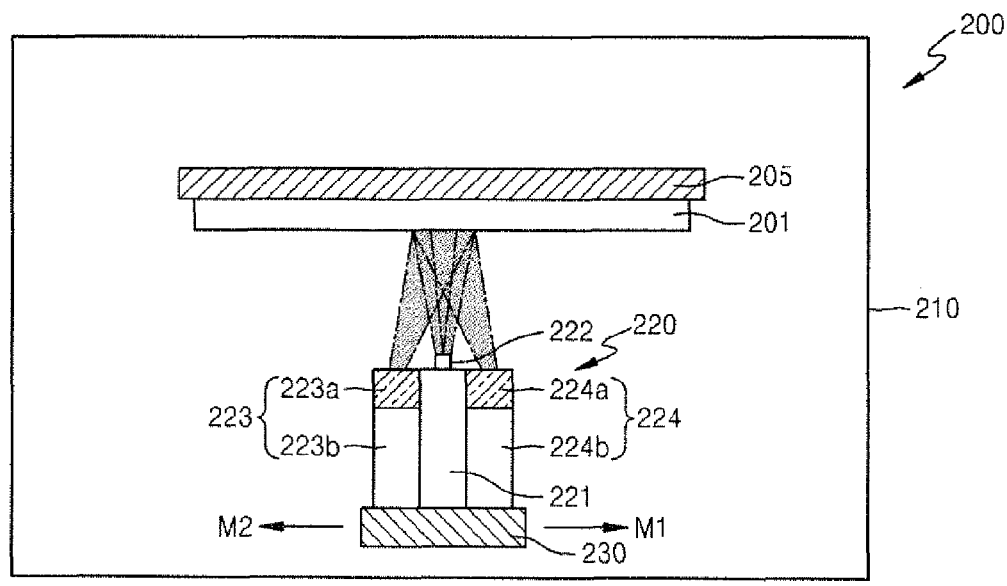
FIG. 2 is a schematic view of a deposition apparatus according to another embodiment of the present invention.

FIG. 2 is a schematic view of a deposition apparatus according to another embodiment of the present invention.

Referring to FIG. 2, a deposition apparatus 200 includes a chamber 210, a deposition source 220, a stage 205, and a driving unit 230.

The stage 205 is disposed inside the chamber 210. A substrate 201 is mounted on one surface of the stage 205. A fixing device (not shown) may be used to fix the substrate 201 mounted on the stage 205. The fixing device may be any of various types of devices, for example, a clamp, a pressing device, an adhesive material, or the like.

The deposition source 220 faces the substrate 201. The deposition source 220 includes a crucible 221, a nozzle 222, and hardening portions 223 and 224.

The crucible 221 accommodates a deposition material (not shown). A heating device, such as a heater (not shown), for heating the deposition material may be disposed around the crucible 221.

The nozzle 222 is connected to the crucible 221 so that the deposition material evaporates, is discharged via the nozzle 222, and then moves toward the substrate 201, thereby forming a deposited film on the substrate 201.

The hardening portions 223 and 224 are disposed at opposite sides of the nozzle 222.

The hardening portion 223 includes a UV irradiation unit 223a and a body 223b. The body 223b generates UV light, and the UV irradiation unit 223a irradiates the generated UV light toward the substrate 201. However, the present invention is not limited thereto, and the UV irradiation unit 223a and the body 223b may be formed as one body.

The hardening portion 224 includes a UV irradiation unit 224a and a body 224b. The body 224b generates UV light, and the UV irradiation unit 224a irradiates the generated UV light toward the substrate 201. However, the present invention is not limited thereto, and the UV irradiation unit 224a and the body 224b may be formed as one body.

The hardening portion 223 and the hardening portion 224 are disposed adjacent to the nozzle 222 to simultaneously harden the deposition material as soon as the deposition material discharged via the nozzle 222 reaches the substrate 201.

The driving unit 230 is connected to the deposition source 220. The driving unit 230 may move the deposition source 220 in a first direction (in a direction of an arrow M1) or in a second direction (in a direction of an arrow M2) that is opposite to the first direction, as shown in FIG. 2.

Hereinafter, operations and effects of the deposition apparatus 200 of the current embodiment will be simply described. The deposition material is seated on the substrate 201 via the nozzle 222 to form the deposited film on the substrate 201. In particular, when an organic material monomer is accommodated in the crucible 221, the organic material monomer is discharged via the nozzle 222 and reaches the substrate 201. Then, the organic material monomer is hardened through the hardening portions 223 and 224, thereby improving characteristics of the deposited film formed on the substrate 201.

Also, desired characteristics of the deposited film may be easily obtained, and the components disposed below the deposited film are prevented from being contaminated during formation of the deposited film.

Also, since the deposition process is performed while moving the deposition source 220, even when the deposition process is performed on the entire surface or a desired surface of the substrate 201, the characteristics of the deposited film may be easily obtained and the components disposed below the deposited film are prevented from being contaminated.

Figure 3:
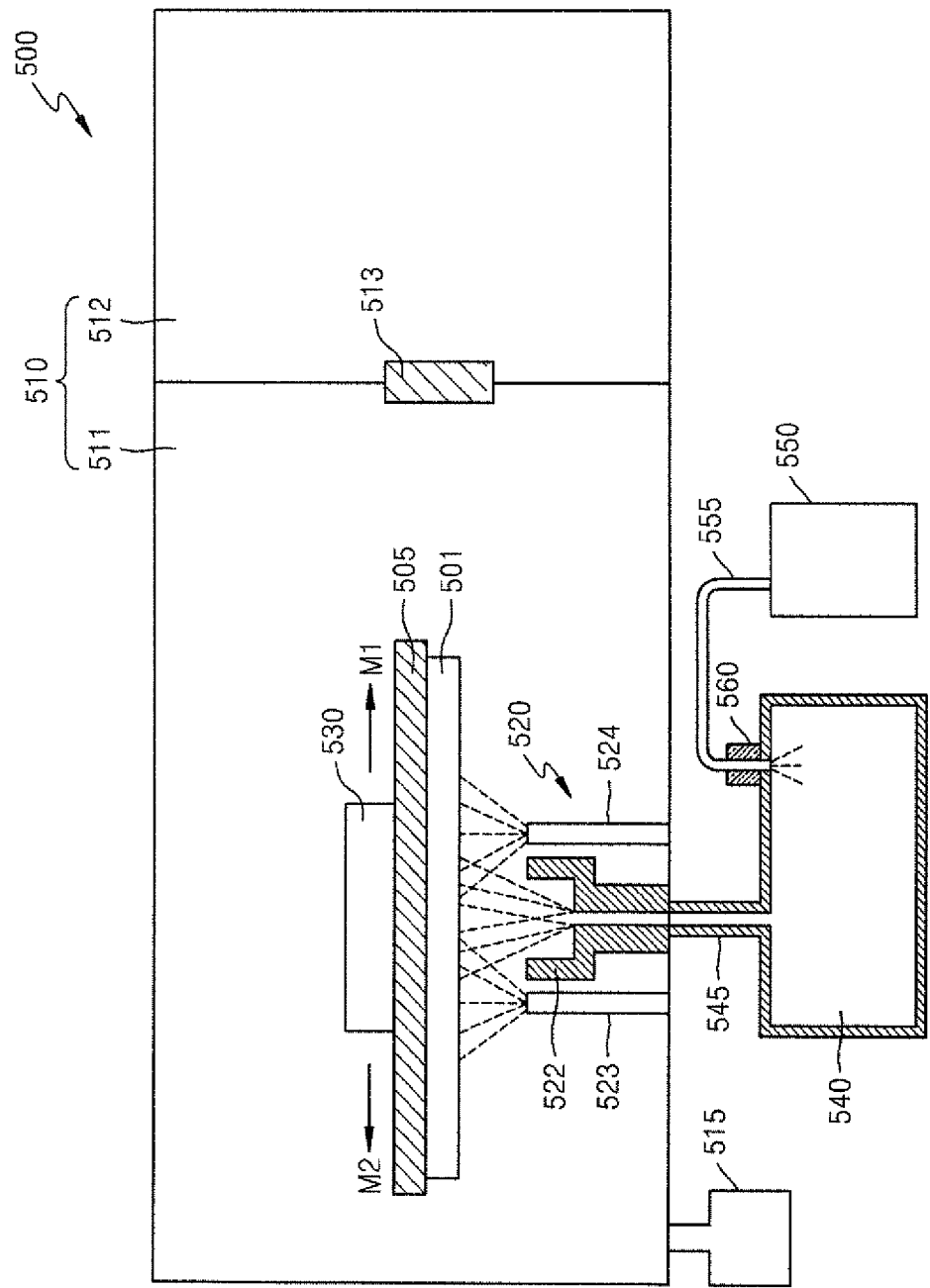
FIG. 3 is a schematic view of a deposition source and a deposition apparatus including the deposition source according to another embodiment of the present invention.

FIG. 3 is a schematic view of a deposition source and a deposition apparatus including the deposition source according to another embodiment of the present invention.

Referring to FIG. 3, a deposition apparatus 500 includes a chamber 510, a deposition source 520, a stage 505, a driving unit 530, an evaporation apparatus 540, and a liquid material supplying apparatus 550.

For convenience of description, differences between the previous embodiments and the current embodiment will be mainly described below.

The chamber 510 includes a process chamber 511 and an align chamber 512.

The stage 505 is disposed inside the process chamber 511. A pump 515 may be connected to the process chamber 511 so as to maintain the process chamber 511 at a desired pressure state.

The align chamber 512 is disposed adjacent to the process chamber 511, and the process chamber 511 and the align chamber 512 are connected to each other via an inlet/outlet 513.

The substrate 501 is aligned by the align chamber 512. In detail, the substrate 501 may be aligned when mounted on the stage 505 from the align chamber 512.

The deposition source 520 faces the substrate 501. The deposition source 520 includes a nozzle 522 and hardening portions 523 and 524. Unlike the previous embodiments, a crucible is not formed in the current embodiment.

The evaporation apparatus 540 is disposed outside of the chamber 510. The evaporation apparatus 540 receives a deposition material from the liquid material supplying apparatus 550. In detail, a liquid material supplied from the liquid material supplying apparatus 550 moves to the evaporation apparatus 540 via a tube 555. In this regard, the liquid material is atomized to the evaporation apparatus 540 via an atomizer 560 disposed at one end of the tube 555.

The deposition material evaporated in the evaporation apparatus 540 through an evaporation process reaches the nozzle 522 through a connecting member 545 and moves toward the substrate 501 from the nozzle 522, thereby forming the deposited film on the substrate 501.

The hardening portions 523 and 524 are disposed at opposite sides of the nozzle 522. Although not shown in FIG. 3, the hardening portions 523 and 524 may include a body for generating UV light and an irradiating unit for irradiating UV light toward the substrate 501.

The driving unit 530 is connected to the stage 505 to move the substrate 501. The driving unit 530 may move the stage 505 in a first direction (in a direction of an arrow M1) or in a second direction (in a direction of an arrow M2) that is opposite to the first direction, as shown in FIG. 3.

Figure 4:
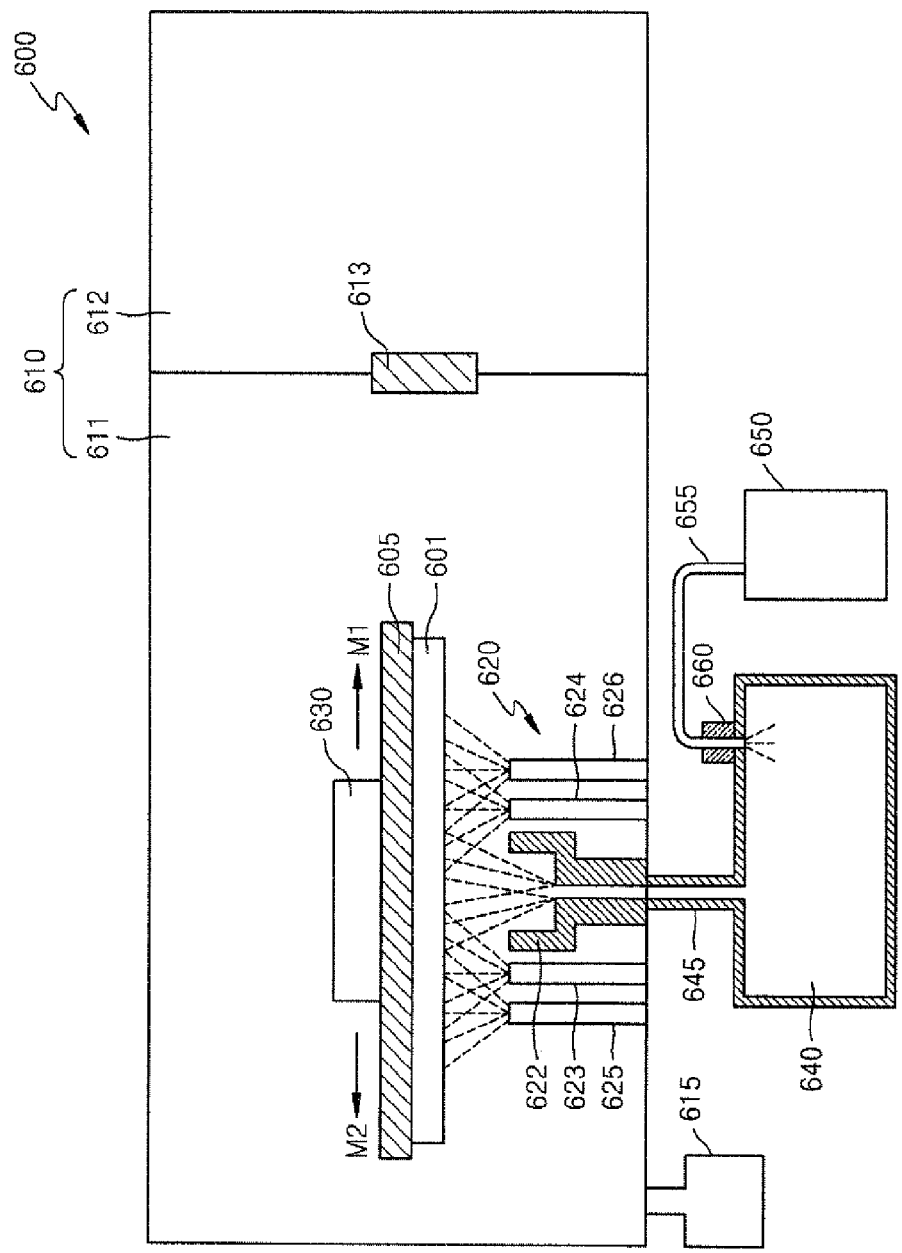
FIG. 4 is a schematic view of a deposition source and a deposition apparatus including the deposition source according to another embodiment of the present invention.

FIG. 4 is a schematic view of a deposition source and a deposition apparatus including the deposition source according to another embodiment of the present invention. For convenience of description, differences between the embodiment of FIG. 3 and the embodiment of FIG. 4 will be mainly described, wherein the deposition apparatus further includes additional hardening portions, compared to the previous embodiments.

Referring to FIG. 4, a deposition apparatus 600 includes a chamber 610, a deposition source 620, a stage 605, a driving unit 630, an evaporation apparatus 640, and a liquid material supplying apparatus 650.

The deposition source 620 faces the substrate 601. The deposition source 620 includes a nozzle 622 and hardening portions 623 and 624 on opposite sides of nozzle 622. Additionally, a hardening portion 625 is disposed to one side of hardening portion 623 and a hardening portion 626 is disposed to one side of hardening portion 624.

The hardening portions 623 and 624 first simultaneously harden a deposition material, and then the hardening portions 625 and 626 complete the hardening of the deposition material.

Figure 5:
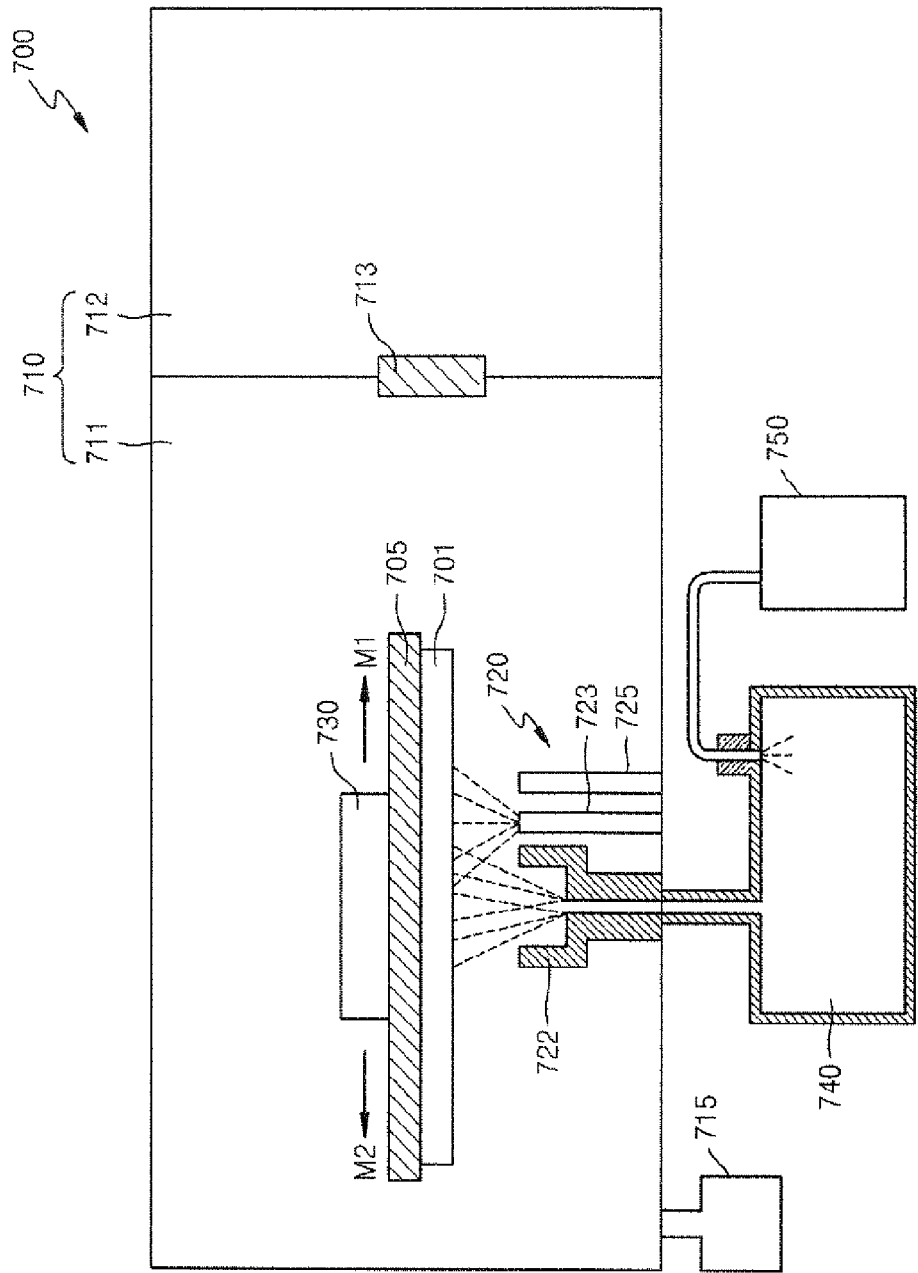
FIG. 5 is a schematic view of a deposition source and a deposition apparatus including the deposition source according to another embodiment of the present invention.

FIG. 5 is a schematic view of a deposition source and a deposition apparatus including the deposition source according to another embodiment of the present invention. For convenience of description, differences between the embodiment of FIG. 4 and the embodiment of FIG. 5 will be mainly described.

Referring to FIG. 5, a deposition apparatus 700 includes a chamber 710, a deposition source 720, a stage 705, a driving unit 730, a pump 715, an evaporation apparatus 740, and a liquid material supplying apparatus 750. The chamber 710 includes a process chamber 711 an inlet/outlet 713 and an align chamber 712.

The deposition source 720 faces a substrate 701. The deposition source 720 includes a nozzle 722 and adjacent hardening portions 723 and 725 disposed to one side of nozzle 722.

The hardening portion 723 hardens a deposition material, and then the hardening portion 725 completes the hardening of the deposition material.

Figure 6:
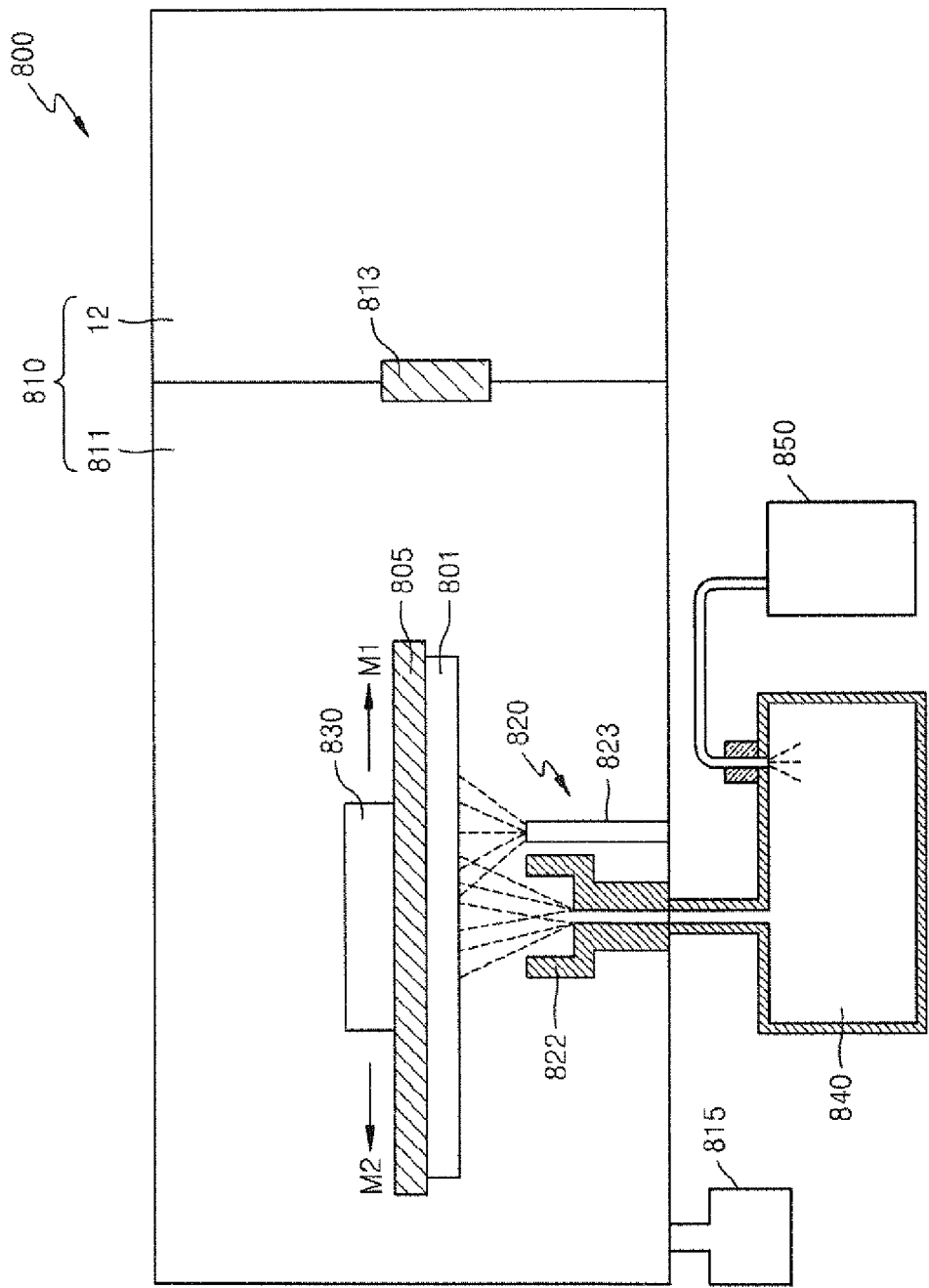
FIG. 6 is a schematic view of a deposition source and a deposition apparatus including the deposition source according to another embodiment of the present invention.

FIG. 6 is a schematic view of a deposition source and a deposition apparatus including the deposition source according to another embodiment of the present invention. For convenience of description, differences between the embodiment of FIG. 5 and the embodiment of FIG. 6 will be mainly described.

Referring to FIG. 6, a deposition apparatus 800 includes a chamber 810, a deposition source 820, a stage 805, a driving unit 830, a pump 815, an evaporation apparatus 840, and a liquid material supplying apparatus 850. The chamber 810 includes a process chamber 811 an inlet/outlet 813 and an align chamber 812.

The deposition source 820 faces a substrate 801. The deposition source 820 includes a nozzle 822 and an adjacent hardening portion 823 disposed to one side of nozzle 822. The hardening portion 823 hardens a deposition material.

FIGS. 7A to 7G are views for describing a method of manufacturing an organic light-emitting display according to an embodiment of the present invention.

Figure 7A:
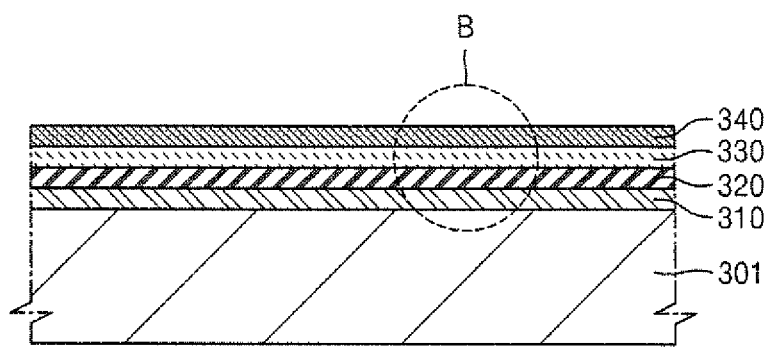
FIGS. 7A to 7G are views for describing a method of manufacturing an organic light-emitting display according to an embodiment of the present invention.

Referring to FIG. 7A, an electrode 310, an intermediate layer 320, an electrode 330, and a buffer layer 340 are formed on a substrate 301.

The substrate 301 may be formed of a $SiO_2$-based transparent glass material. However, the present invention is not limited thereto, and the substrate 301 may be formed of a transparent plastic material. In this regard, the transparent plastic material may be one or more materials selected from various organic materials.

Electrode 310 may serve as an anode, and electrode 330 may serve as a cathode. Alternatively, polarities of electrode 310 and electrode 330 may be reversed.

When electrode 310 serves as an anode, electrode 310 may be formed of a high-work function material, for example, indium tin oxide (ITO), indium zinc oxide (IZO), zinc oxide (ZnO), $In_2O_3$, etc. Also, electrode 310 may further include a reflective film formed of Ag, Mg, Al, Pt, Pd, Au, Ni, Nd, Ir, Cr, Li, Yb, Ca, or the like according to objects and design conditions.

The intermediate layer 320 includes an organic emission layer so as to emit visible light. Intermediate layer 320 may be formed of a low-molecular weight organic layer or a polymer organic layer. When intermediate layer 320 is formed of a low-molecular weight organic layer, intermediate layer 320 may include a hole injection layer (HIL), a hole transport layer (HTL), an organic emission layer, an electron transport layer (ETL), an electron injection layer (EIL), and the like.

The HIL may be formed of a phthalocyanine compounds such as copper phthalocyanine (CuPc), or TCTA, m-MT-DATA, or m-MTDAPB, which is a starburst amine-based material.

The HTL may be formed of, for example, N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like.

The EIL may be formed of, for example, LiF, NaCl, CsF, Li2O, BaO, Liq, or the like.

The ETL may be formed of, for example, $Alq_3$.

The organic emission layer may include a host material and a dopant material.

Examples of the host material may include tris 8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis 2,2-diphenyl-ethene-1-yl)-4,4'-dimethylphenyl (DPVBi), 4,4'-bis 2,2-diphenyl-ethene-1-yl)-4,4'-dimethylphenyl (p-DMDPVBi), tert 9,9-diarylfluorene)s (TDAF), 2-9,9'-spirobifluorene-2-yl)-9,9'-spirobifluorene(BSDF), 2,7-bis 9,9'-spirobifluorene-2-yl)-9,9'-spirobifluorene (TSDF), bis 9,9-diarylfluorene)s (BDAF), 4,4'-bis 2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis 9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis 9-phenyl-9H-carbazol)fluorene (FL-4CBP), 4,4'-bis(carbazol-9-yl)-9,9-di-tolyl-fluorene (DPFL-CBP), 9,9-bis 9-phenyl-9H-carbazol)fluorene (FL-2CBP), etc.

Examples of the dopant material may include DPAVBi 4,4'-bis[4-(di-p-tolylamino)styryl]biphenyl), ADN 9,10-di (naph-2-tyl)anthracene), TBADN 3-tert-butyl-9,10-di(naph-2-tyl)anthracene), etc.

When electrode 330 serves as a cathode, electrode 330 may be formed of silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). Also, electrode 330 may include ITO, IZO, ZnO, In2O3, or the like so that light may penetrate electrode 330. Electrode 330 may be formed as a common electrode so that a common voltage is applied to all sub-pixels.

The buffer layer 340 may be formed of an insulating material. Buffer layer 340 protects electrode 330 disposed under the buffer layer 340. Buffer layer 340 may not be an essential component and may be excluded when required.

Figure 7B:
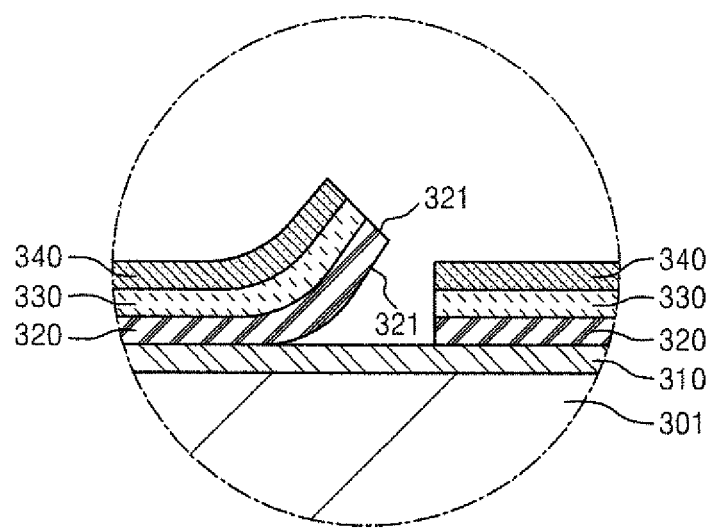

FIG. 7B is an enlarged view of section B shown in FIG. 7A. Referring to FIG. 7B, the intermediate layer 320 may include exposed surfaces 321. In other words, when the intermediate layer 320 is formed by using a deposition process or any other method, a surface of the intermediate layer 320 may expand due to shapes of the components disposed below the intermediate layer 320 or various other factors or may protrude from a top surface of electrode 310 disposed under the intermediate layer 320.

A protruding portion of the intermediate layer 320 may protrude above electrode 330 and buffer layer 340, and thus exposed surfaces 321 of the intermediate layer 320 may be exposed to the outside when not covered by electrode 330 and buffer layer 340.

Figure 7C:
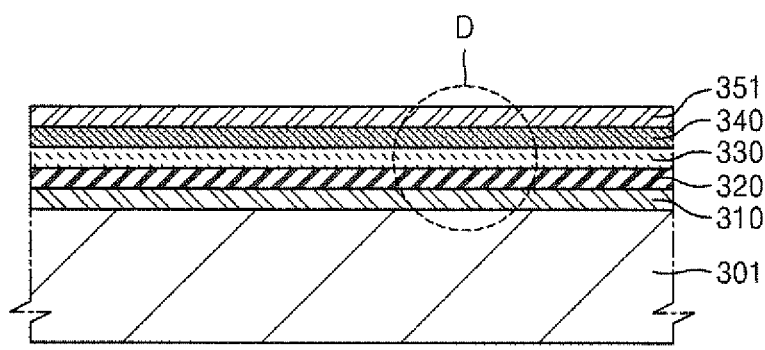
Figure 7D:
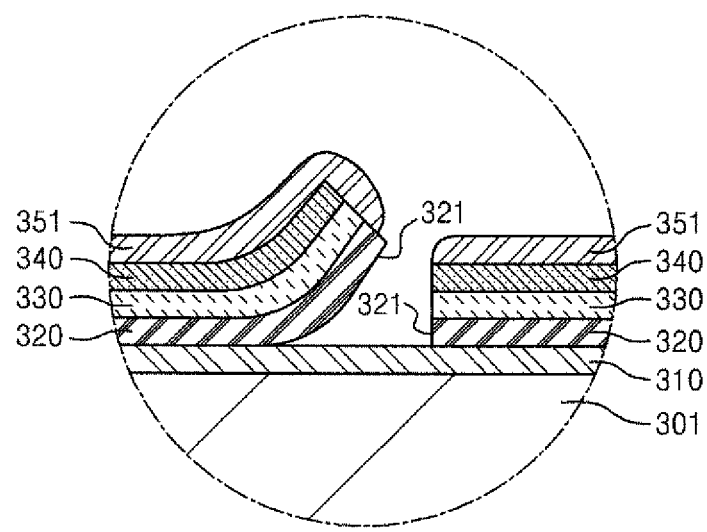

Referring to FIGS. 7C and 7D, an inorganic encapsulation layer 351 is formed on buffer layer 340. FIG. 7D is an enlarged view of section D shown in FIG. 7C.

Referring to FIG. 7D, the inorganic encapsulation layer 351 does not completely cover the exposed surfaces 321 of the intermediate layer 320. In other words, the inorganic encapsulation layer 351 may not cover the exposed surfaces 321 of the intermediate layer 320 due to material characteristics and a thickness of the inorganic encapsulation layer 351. The inorganic encapsulation layer 351 may be formed of any of various materials, for example, silicon oxide, silicon nitride, aluminum oxide, zirconium oxide, Al-doped zinc oxide (AZO), or the like.

Figure 7E:
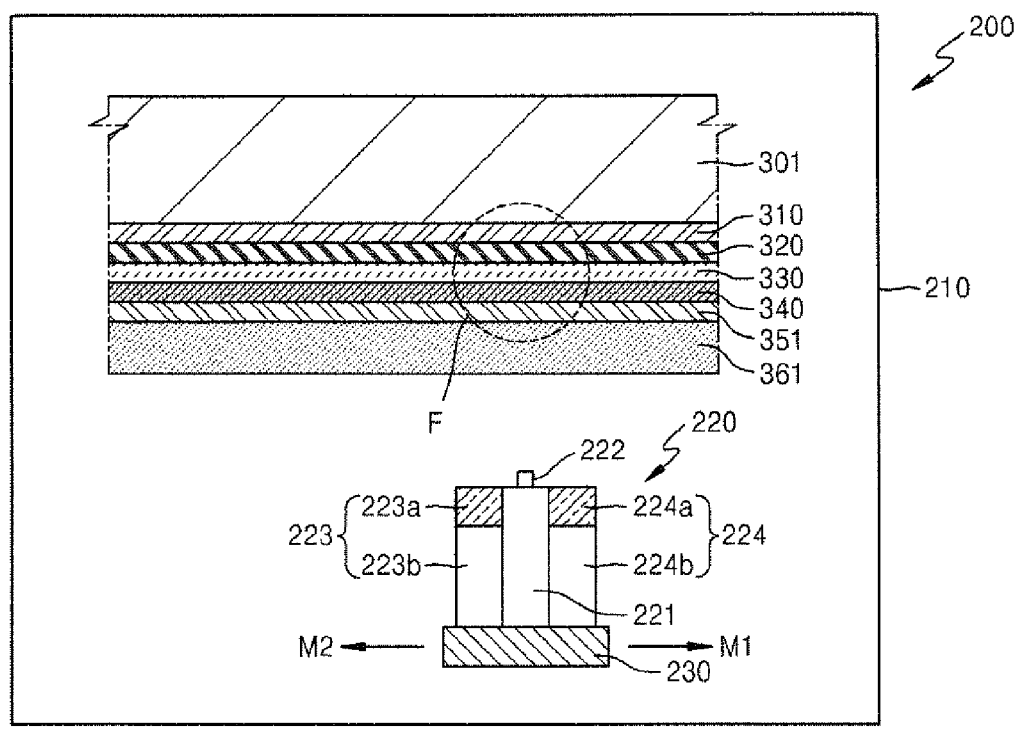
Figure 7F:
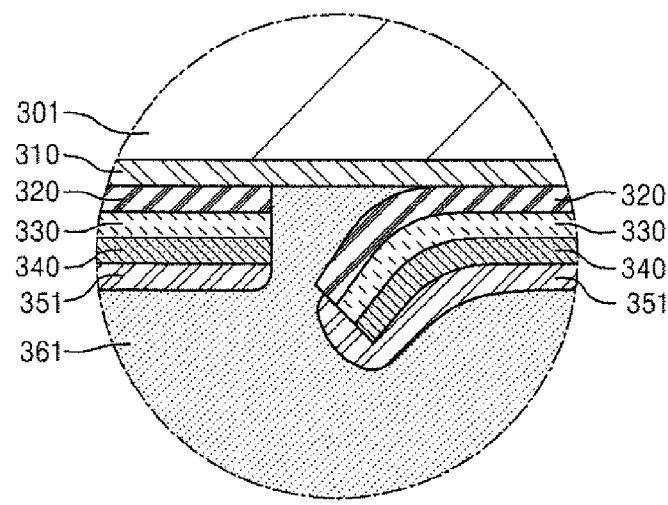

Referring to FIGS. 7E and 7F (an enlarged view of section F shown in FIG. 7E), an organic encapsulation layer 361 is formed on the inorganic encapsulation layer 351. In detail, the organic encapsulation layer 361 is formed by using the deposition apparatus 200 shown in FIG. 2. However, the present invention is not limited thereto. That is, the organic encapsulation layer 361 may be formed by using any of the deposition apparatuses shown in FIG. 1, 2, 3, 4, 5 or 6.

In detail, an organic material monomer film for forming the organic encapsulation layer 361 is formed on the inorganic encapsulation layer 351 via the nozzle 222 of deposition source 220. In this regard, the organic material monomer may include acryl, an epoxy-based monomer, or a silicon-based monomer. As soon as the organic material monomer film is formed on the inorganic encapsulation layer 351, the organic material monomer film is immediately hardened by using the hardening portions 223 and 224 simultaneously, thereby forming the organic encapsulation layer 361.

Accordingly, an organic material or other impurities may be prevented from penetrating into the intermediate layer 320, particularly, into any exposed surfaces of the intermediate layer 320, from the organic material monomer film.

Here, the organic encapsulation layer 361 may be easily formed on the entire surface or a desired surface of the inorganic encapsulation layer 351 by performing a deposition process while moving the deposition source 220 by using the driving unit 230. In this regard, the intermediate layer 320 may be effectively prevented from being damaged through a series of operations of the nozzle 222 and the hardening portions 223 and 224.

Figure 7G:
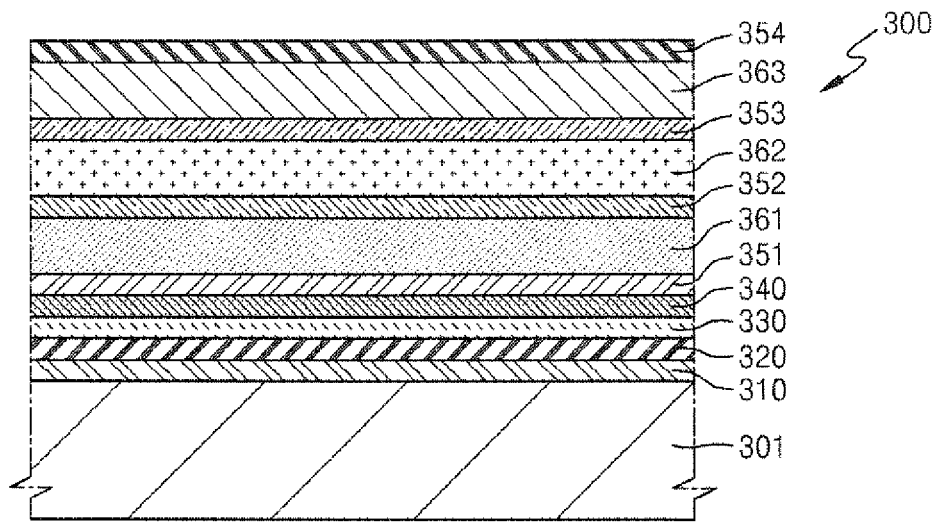

Referring to FIG. 7G, an inorganic encapsulation layer 352, an organic encapsulation layer 362, an inorganic encapsulation layer 353, an organic encapsulation layer 363, and an inorganic encapsulation layer 354 are sequentially formed, thereby completing formation of the organic light-emitting display.

The inorganic encapsulation layer 352, the organic encapsulation layer 362, the inorganic encapsulation layer 353, the organic encapsulation layer 363, and the inorganic encapsulation layer 354 may include at least one of the above-described materials of the inorganic encapsulation layer 351 and the organic encapsulation layer 361.

Alternatively, in the present invention, the organic encapsulation layer 363 and the inorganic encapsulation layer 354 may be omitted. Alternatively, the organic encapsulation layer 362, the inorganic encapsulation layer 353, the organic encapsulation layer 363, and the fourth inorganic encapsulation layer 354 may be omitted.

In the described organic light-emitting display of FIGS. 7A-7G, intermediate layer 320, electrode 310, and electrode 330 may be effectively protected through a structure in which inorganic encapsulation layers and organic encapsulation layers are stacked on electrode 330.

In this regard, the organic encapsulation layer 361 is formed by immediately hardening the organic material monomer film through the hardening portions 223 and 224 (FIG. 2) as soon as the organic material monomer film is formed on the inorganic encapsulation layer 351 via the nozzle 222 (FIG. 2), and thus any exposed surfaces of the intermediate layer 320 may be effectively prevented from being contaminated.

Figure 8:
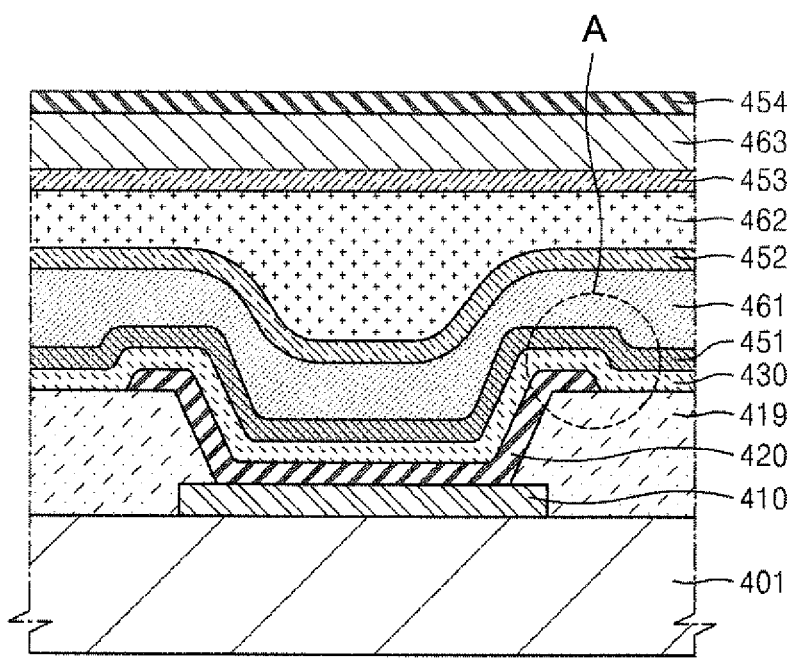
FIGS. 8 and 9 are schematic cross-sectional views of another organic light-emitting display manufactured by using the deposition apparatuses of FIGS. 1 and 2.
Figure 9:
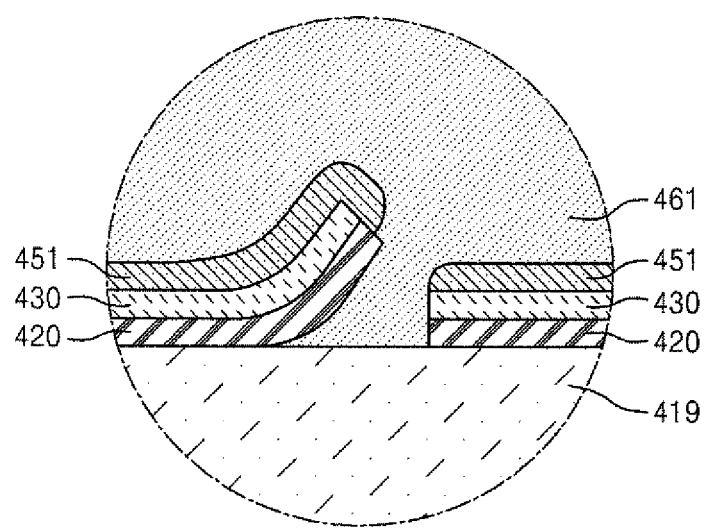

FIGS. 8 and 9 are schematic cross-sectional views of another organic light-emitting display manufactured by using any of the deposition apparatuses of FIGS. 1-6. FIG. 9 is an enlarged view of section A shown in FIG. 8. For convenience of description, differences between the previous embodiments and the current embodiment will be mainly described below.

An electrode 410 is formed on a substrate 401, and a pixel-defining layer 419 is formed on electrode 410. The pixel-defining layer 419 is formed not to cover at least a part of a top surface of electrode 410.

An intermediate layer 420 is formed on electrode 410 and a portion of pixel-defining layer 419. The intermediate layer 420 includes an organic emission layer so as to emit visible light.

An electrode 430 is formed on the intermediate layer 420.

An inorganic encapsulation layer 451, an organic encapsulation layer 461, an inorganic encapsulation layer 452, an organic encapsulation layer 462, an inorganic encapsulation layer 453, an organic encapsulation layer 463, and an inorganic encapsulation layer 454 are formed on electrode 430. Although not shown in FIG. 8, a buffer layer may be formed on electrode 430 and inorganic encapsulation layer 451.

In the described embodiment, a part of the intermediate layer 420 may be uplifted, or protrude, and an extent of the uplift, or protrusion, of the intermediate layer 420 may be great due to the shape of the pixel-defining layer 419 formed under the intermediate layer 420. Thus, the intermediate layer 420 may not be completely covered by electrode 430 and the inorganic encapsulation layer 451.

The organic encapsulation layer 461 is then formed on the inorganic encapsulation layer 451. In detail, the organic encapsulation layer 461 is formed by using, for example, the deposition apparatus 100 or the deposition apparatus 200 shown in FIG. 1 or 2, respectively.

Accordingly, an organic material or other impurities from an organic material monomer material layer may be prevented from penetrating into the intermediate layer 420, particularly, into any surface that is not covered by electrode 430 and inorganic encapsulation layer 451 from among surfaces of the intermediate layer 420.

In the organic light-emitting display of the embodiment of FIG. 8, intermediate layer 420, electrode 410, and electrode 430 may be effectively protected through a structure in which inorganic encapsulation layers and organic encapsulation layers are stacked on electrode 430.

In this regard, the organic encapsulation layer 461 is formed by immediately hardening the organic material monomer film as soon as the organic material monomer film is formed on the inorganic encapsulation layer 451, and thus the organic encapsulation layer 461 prevents the intermediate layer 420 from being contaminated.

Although not particularly described here, the organic light-emitting display of FIG. 8 may be formed by using any of the deposition apparatuses 500, 600, 700, and 800 shown in FIGS. 3 to 6, respectively.

A deposition source, a deposition apparatus, and a method of manufacturing an organic light-emitting display may easily improve characteristics of a deposited film and encapsulation characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display device, the method comprising:
    forming a first electrode on a substrate;
    forming an intermediate layer comprising an organic emission layer on the first electrode;
    forming a second electrode on the intermediate layer;
    forming a first inorganic encapsulation layer on the second electrode;
    forming a first organic encapsulation layer by disposing an organic material on the first inorganic encapsulation layer through a nozzle of a deposition apparatus discharging the organic material toward the substrate, within a time range after the organic material reaches the substrate and before the organic material permeates into and contaminates the intermediate layer;
    performing initial hardening using hardening portions of the deposition apparatus disposed adjacent to the nozzle, the adjacent hardening portions of the deposition apparatus simultaneously hardening the organic material; and
    performing completion of the hardening using other hardening portions of the deposition apparatus; and, during the disposing and the hardening, moving the nozzle and the hardening portions relative to the substrate.

2. The method of claim 1, the hardening of the organic material being performed by emitting ultraviolet (UV) light from the hardening portion.

3. The method of claim 1, further comprising the intermediate layer having a portion being exposed due to incomplete coverage by the electrodes and the first inorganic encapsulation layer.

4. The method of claim 1, further comprising forming a second inorganic encapsulation layer on the first organic encapsulation layer.

5. The method of claim 4, further comprising forming at least one inorganic encapsulation layer and at least one organic encapsulation layer on the second inorganic encapsulation layer.

6. The method of claim 1, wherein the organic material is an organic material monomer comprising one of acryl, an epoxy-based monomer or a silicon-based monomer.

* * * * *